United States Patent [19]

Orisaka et al.

[11] Patent Number: 5,289,063
[45] Date of Patent: Feb. 22, 1994

[54] OUTPUT CIRCUIT WITH BUFFER

[75] Inventors: Yukihisa Orisaka, Tenri; Junji Tanaka, Sakurai; Yoshiki Sano, Kashihara, all of Japan

[73] Assignee: Sharp Kabushiki Kaisha, Osaka, Japan

[21] Appl. No.: 960,872

[22] Filed: Oct. 14, 1992

[30] Foreign Application Priority Data

Oct. 14, 1991 [JP] Japan .................................. 3-295018

[51] Int. Cl.⁵ ............................................. H03K 17/04
[52] U.S. Cl. .................................. 307/597; 307/246; 307/603
[58] Field of Search ............... 307/443, 246, 597, 592, 307/603, 239, 260

[56] References Cited

U.S. PATENT DOCUMENTS

| | | | |
|---|---|---|---|
| 3,393,325 | 7/1965 | Borror et al. | 307/205 |
| 3,395,291 | 9/1965 | Bogert | 307/205 |
| 4,631,425 | 12/1986 | Koshimaru | 307/449 |
| 4,642,491 | 2/1987 | Kenney et al. | 307/246 |
| 4,950,925 | 8/1990 | Doi et al. | 307/446 |
| 5,003,205 | 3/1991 | Kohda et al. | 307/443 |

FOREIGN PATENT DOCUMENTS 0351820 1/1990 European Pat. Off. .
1125218 8/1968 United Kingdom .

OTHER PUBLICATIONS

Dictionary of Electronics 2nd Ed. Penguin Books Copyright 1988 p. 365,6 FIG. C "Ratioless Circuit".

Primary Examiner—William L. Sikes
Assistant Examiner—Shawn Riley

[57] ABSTRACT

An output circuit having a buffer, the buffer including the first transistor which receives at a gate thereof a periodic input voltage and the second transistor, the first and the second transistors being connected in series across a power line and a ground line, a junction of the first and second transistors being connected to an output terminal. The output circuit includes a circuit for applying, to a gate of the second transistor, a first voltage for the second transistor to serve as a bias transistor for charging a load connected to the output terminal with a voltage corresponding to the input voltage, and the second voltage greater than the first voltage for the second transistor to serve as a discharge transistor for discharging the load.

4 Claims, 3 Drawing Sheets

OUTPUT CIRCUIT WITH BUFFER

BACKGROUND OF THE INVENTION

1. Field of the Invention

The present invention relates to an output circuit with a buffer.

2. Description of the Related Art

FIG. 3 shows a prior output circuit. In the output circuit, a source follower transistor N1 and a bias transistor N2 constitute an output buffer. N4 denotes a discharge transistor whose drain is connected to an output terminal TOUT. The gate of the transistor N4 is given a periodic discharge pulse DIS for the purpose of discharging a load LD, and the gate of the transistor N2 is given a constant bias voltage Vb as shown in FIG. 4

When an input voltage VIN is applied to the gate of the transistor N1 and the constant bias voltage Vb is applied to the gate of the transistor N2, an output voltage according to the input voltage VIN is supplied to the load LD. The discharge pulse DIS is applied to the gate of the transistor N4 in synchronism with the periodic input voltage VIN. After the load Ld is discharged through the transistor N4, the load LD is charged again according to the input voltage VIN.

The above described output circuit has a problem that it takes not a little time to discharge the load LD due to the limit of the discharge capacity of the transistor N4, and to charge the load LD to a sufficient voltage level for the output circuit to output a voltage corresponding to the input voltage since the load LD is completely discharged to the ground level.

SUMMARY OF THE INVENTION

The object of the present invention is to eliminate such problem and provide a high speed output circuit.

The object of the invention can be achieved by an output circuit comprising:

a buffer including a first transistor which receives at a gate thereof a periodic input voltage and a second transistor, said first and second transistors being connected in series across a power line and a ground line, a junction of said first and second transistors being connected to an output terminal; and means for applying, to a gate of said second transistor, a first voltage for said second transistor to serve as a bias transistor for charging a load connected to said output terminal with a voltage corresponding to said input voltage, and a second voltage larger than said first voltage for said second transistor to serve as a discharge transistor for discharging said load.

In the output circuit according to the present invention, the second transistor constituting a buffer serves as a discharge transistor during a discharge period. Therefore, a load connected to the output circuit can be discharged through both the second and fourth transistors, thereby shortening the discharge time. And by adjusting a period of time during which the third and fourth transistors are at ON state, it is possible to discharge the load to a certain level greater than the ground level, thereby shortening the charging time. Therefore, the output circuit according to the present invention can operate at a high speed.

Further, by putting the first transistor constituting the buffer to an OFF state during the discharge period, a through current flowing through the first and the second transistors can be reduced.

Further objects and advantages of the present invention will be apparent from the following description of the preferred embodiment of the invention as illustrated in the accompanying drawings.

DESCRIPTION OF THE PREFERRED EMBODIMENT

Figure 1:
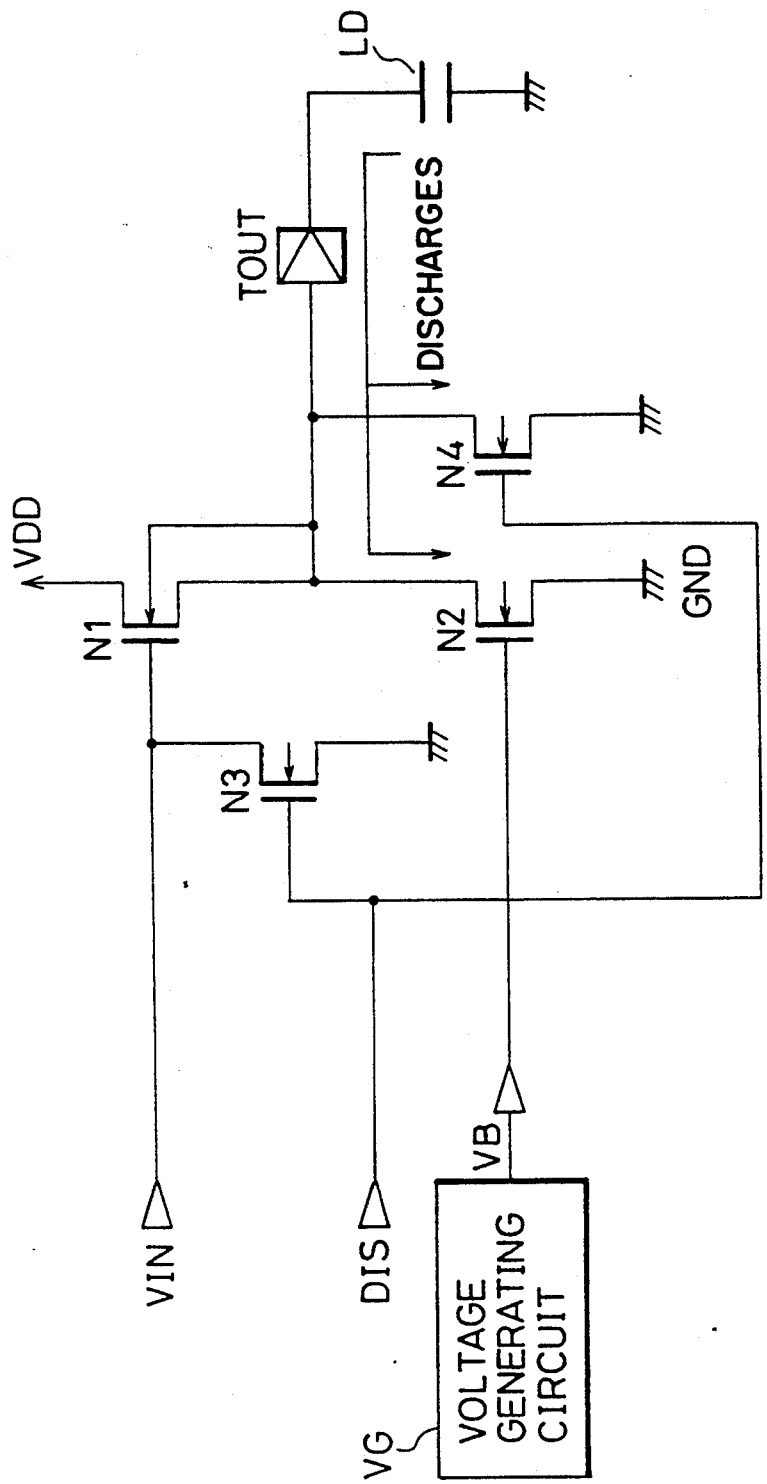
FIG. 1 is a circuit diagram of an output circuit with a buffer of an embodiment according to the present invention.
Figure 3:
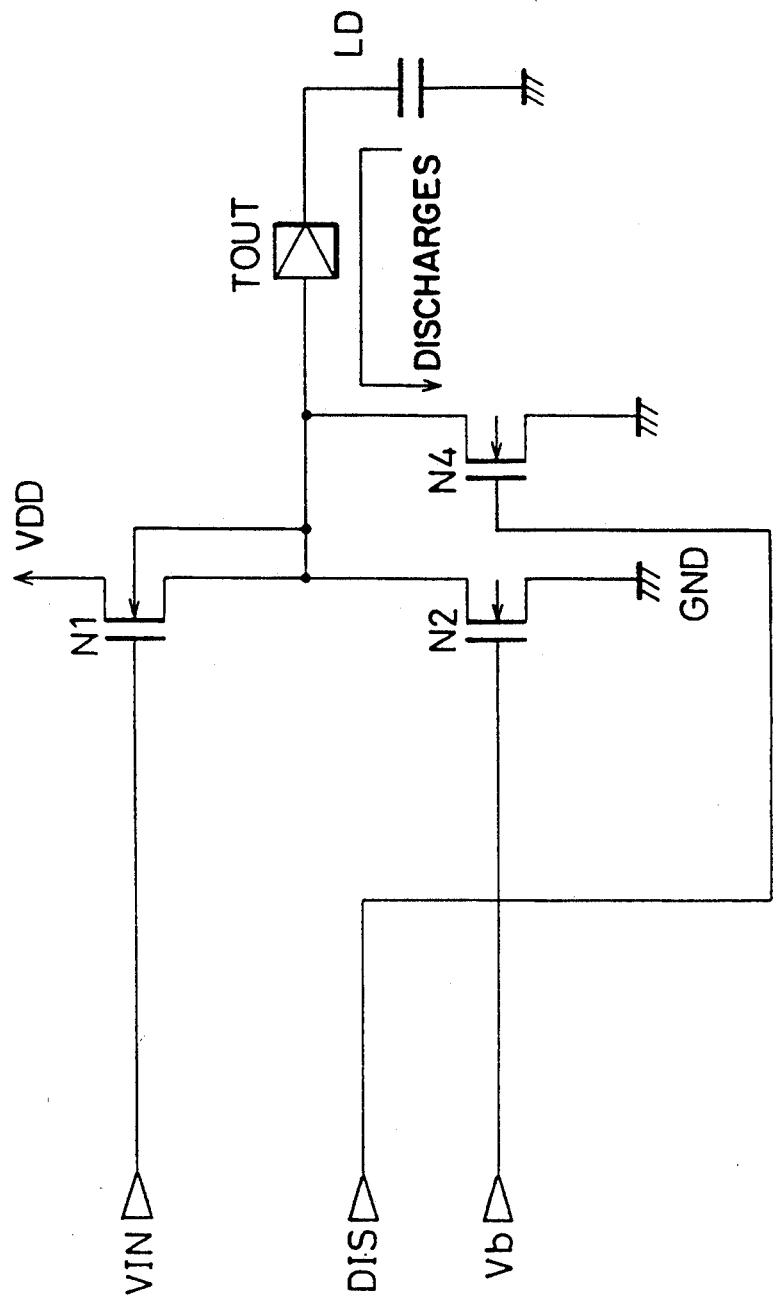
FIG. 3 is a circuit diagram of a prior output circuit with a buffer.

FIG. 1 is a circuit diagram of an output circuit with a buffer of an embodiment according to the present invention. In FIG. 1, the same element as that shown in FIG. 3 is given the same reference and explanation thereof is omitted.

Figure 2:
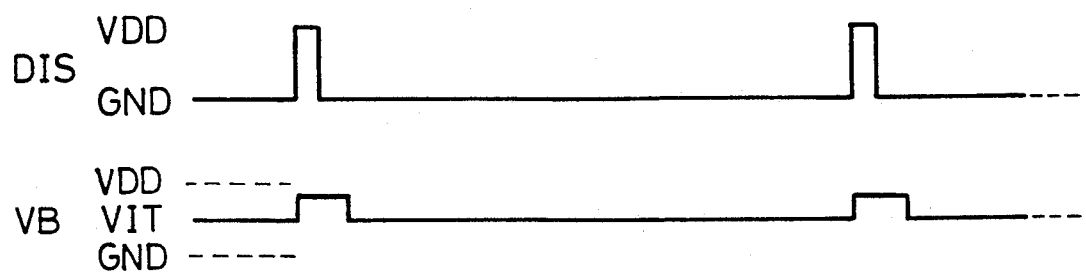
FIG. 2 is a view showing waveforms of a discharge pulse and a bias voltage supplied to the output circuit of FIG. 1.
Figure 4:
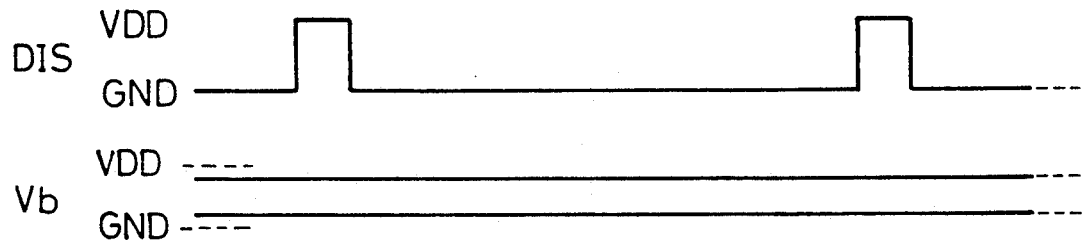
FIG. 4 is a view showing waveforms of a discharge pulse and a bias voltage supplied to the output circuit of FIG. 3.

In FIG. 1, N3 denotes a transistor connected between the gate of the source follower transistor N1 and the ground GND. The gate of the transistor N3 is supplied with the discharge pulse DIS shown in FIG. 2 which is also applied to the gate of the discharge transistor N4. The gate of the bias transistor N2 is supplied with a bias voltage VB generated by a voltage generating circuit VG, the bias voltage VB being at a level of VIT which is between VDD and GND except the discharge period, and at the VDD level during the discharge period as shown in FIG. 2.

Accordingly, when the input voltage VIN is applied to the gate of the source follower transistor N1 constituting the buffer and the bias voltage VB at the VIT level is applied to the gate of the transistor N2, a voltage corresponding to the input voltage VIN is outputted from the output terminal TOUT and supplied to the load LD.

To discharge the load LD, the discharge pulse DIS is applied to the gates of the transistors N3 and N4, and at the same time, the level of the bias voltage VB applied to the gate of the transistor N2 is increased to a certain level greater than VIT, whereby the charges in the load LD are released through not only the transistor N4 but the transistor N2.

Accordingly, a large amount of charges can be released rapidly so that the time required for discharge can be reduced. Further, by adjusting the duration of the discharge pulse DIS, it is possible to discharge the load LD to a certain level greater than the ground level in order that the time required for charging the load LD again according to the level of the input signal VIN is reduced.

While the load LD is discharged, the gate of the transistor N3 is at VDD level, therefore, the drain of the transistor N3 is at the ground level and the transistor N1 is at OFF state. Whereby a through current flowing through the transistors N1 and N2 is reduced.

In a case where high speed operation is not required, it is possible to carry out the discharge by the transistors N2 and N3 without the transistor N4, therefore, the number of transistors can be reduced in that case, thereby reducing the size of the output circuit.

Many widely different embodiments of the present invention may be constructed without departing from the spirit and scope of the present invention. It should be understood that the present invention is not limited to the specific embodiment described in the specification, except as defined in the appended claims.

What is claimed is:

1. An output circuit comprising:
    a buffer including
        a first transistor which receives at a gate thereof a periodic input voltage;
        a second transistor, said first and second transistors being connected in series across a first level voltage and a second level voltage lower than said first level voltage, a junction of said first and second transistors being connected to an output terminal; and
        a third transistor whose drain and source are connected to said output terminal and said second level voltage respectively, a gate of said third transistor receiving a periodical pulse signal for setting said third transistor to an ON state for discharging a load connected to said output terminal therethrough; and
    means for applying, to a gate of said second transistor, a first voltage for said second transistor to serve as a bias transfer for charging said load connected to said output terminal with a voltage corresponding to said input voltage, and a second voltage greater than said first voltage for said second transistor to serve as a discharge transistor for discharging said load,
    said periodical pulse signal having a pulse width sufficient to discharge said load to a residual level greater than said second level voltage in order that the time required for charging said load again according to the level of said periodic input voltage is reduced.

2. An output circuit according to claim 1, further comprising means for setting said first transistor to an OFF state in synchronism with said second voltage.

3. An output circuit according to claim 2, wherein said means for setting said first transistor to the OFF state comprises a fourth transistor whose drain and source are connected to said gate of said first transistor and to said second level voltage respectively, a gate of said third transistor receiving said periodical pulse signal.

4. An output circuit according to claim 3, wherein said first level voltage and said second voltage are a VDD level voltage and a ground level voltage, respectively.

* * * * *